United States Patent
Yang et al.

(10) Patent No.: US 8,027,426 B1
(45) Date of Patent: Sep. 27, 2011

(54) SHIFT REGISTER

(75) Inventors: Yu-Chung Yang, Hsin-Chu (TW);
Kuo-Chang Su, Hsin-Chu (TW);
Yung-Chih Chen, Hsin-Chu (TW);
Chun-Hsin Liu, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/837,244

(22) Filed: Jul. 15, 2010

(30) Foreign Application Priority Data

Mar. 19, 2010 (TW) ................................ 99108255 A

(51) Int. Cl.
*G11C 19/00* (2006.01)
(52) U.S. Cl. ................. 377/64; 377/68; 377/78; 377/79
(58) Field of Classification Search ......................... None
See application file for complete search history.

(56) References Cited

U.S. PATENT DOCUMENTS

| | | | |
|---|---|---|---|
| 5,631,940 A * | 5/1997 | Fujikura | 377/64 |
| 7,848,477 B2 * | 12/2010 | Cheng et al. | 377/64 |
| 2007/0019775 A1 * | 1/2007 | Tsai et al. | 377/64 |
| 2007/0273426 A1 | 11/2007 | Cantatore | |
| 2011/0069047 A1 * | 3/2011 | Koyama et al. | 345/204 |

* cited by examiner

*Primary Examiner* — Tuan Lam
(74) *Attorney, Agent, or Firm* — WPAT, PC; Justin King

(57) ABSTRACT

An exemplary shift register includes a plurality of transistors. The transistors are subjected to the control of a start pulse signal, a first clock signal and a second clock signal to generate a gate driving signal. The first clock signal and the second clock signal are phase-inverted with respect to each other. A logic low level of the first clock signal and another logic low level of the second clock signal are different from each other. Moreover, the transistors are negative threshold voltage transistors. A potential at the gate of the each of the transistors is lower than another potential at the source/drain of the transistor at the situation of the transistor being switched-off state.

5 Claims, 2 Drawing Sheets

SHIFT REGISTER

CROSS-REFERENCE TO RELATED APPLICATIONS

This application is based upon and claims the benefit of priority from the prior Taiwan Patent Application No. 099108255, filed Mar. 19, 2010, the entire contents of which are incorporated herein by reference.

BACKGROUND

1. Technical Field

The present invention generally relates to display technology fields and, particularly to a shift register.

2. Description of the Related Art

In the prior art, a shift register is proposed to be fabricated directly on a substrate for example a glass substrate, and a process for fabricating the shift register primarily is an amorphous silicon process. Since the amorphous silicon material has low carrier mobility, large size thin film transistors are necessarily needed to be designed for effectively driving scan lines of display panel. However, the large-sized thin film transistors inevitably occupy much more space of the display panel, and thus it is unsatisfactorily to be applied display panel products having narrow border or limited circuit region. Furthermore, large-sized thin film transistors would cause large parasitic capacitance effect, resulting in the increase of power consumption on clock pulse signal lines. In other words, the approach of fabricating the shift register directly on the substrate although can reduce the cost of gate driving circuit, if the size and power consumption issues associated with the thin film transistors would not be improved, the application of such approach inevitably is limited.

Accordingly, if a semiconductor material having high carrier mobility is attempted to be applied to the design of shift register, the size of the thin film transistor might be effectively minimized and the power consumption correspondingly can be decreased. Generally, the semiconductor material having high carrier mobility has larger switch-on current as well as switch-off current. Taking indium gallium zinc oxide (IGZO) as recently proposed as an example, a carrier mobility of IGZO is about 5 volts per meter-second (V/m·s), and a threshold voltage of the finally-completed thin film transistor is about −5 volts. Accordingly, if attempting to apply the IGZO semiconductor material to the shift register associated with the prior art, a large leakage current would be produced, which results in the shift register being unserviceable.

BRIEF SUMMARY

Accordingly, the present invention is directed to a shift register, so as to address the issues associated with the prior art.

More specifically, a shift register in accordance with an embodiment of the present invention includes a plurality of transistors subjected to the control of a start pulse signal, a first clock pulse signal and a second clock pulse signal to generate a gate driving signal. The first clock pulse signal is phase-inverted with respect to the second clock pulse signal. A logic low level of the first clock pulse signal is different from a logic low level of the second clock pulse signal. Moreover, the transistors are negative threshold voltage transistors. A potential at the gate of the each of the transistors is lower than another potential at the source/drain of the transistor at the situation of the transistor being switched-off state.

In one embodiment, the transistors include a first transistor, a second transistor and a third transistor. The gate of the first transistor is electrically coupled to receive the first clock pulse signal and further electrically coupled to the drain/source of the first transistor through a coupling capacitor, the source/drain of the first transistor is electrically coupled to a power supply voltage, and a level of the power supply voltage is higher than the logic low level of the first clock pulse signal but lower than the logic low level of the second clock pulse signal. The gate of the second transistor is electrically coupled to receive the first clock pulse signal, the source/drain of the second transistor is electrically coupled to the drain/source of the first transistor, and the drain/source of the second transistor is electrically coupled to receive the start pulse signal. The gate of the third transistor is electrically coupled to the drain/source of the first transistor, the source/drain of the third transistor is for outputting the gate driving signal, and the drain/source of the third transistor is electrically coupled to receive the second clock pulse signal.

In one embodiment, the source/drain of the third transistor is further electrically coupled to the gate of the third transistor through another coupling capacitor.

In one embodiment, the transistors further include a fourth transistor. The gate of the fourth transistor is electrically coupled to the drain/source of the first transistor, the source/drain of the fourth transistor is for outputting another start pulse signal, and the drain/source of the fourth transistor is electrically coupled to the drain/source or the source/drain of the third transistor.

In one embodiment, the transistors further include a fifth transistor. The gate of the fifth transistor is electrically coupled to receive the first clock pulse signal, the source/drain of the fifth transistor is electrically coupled to receive a second power supply voltage, a level of the second power supply voltage is substantially equal to the logic low level of the second clock pulse signal, and the drain/source of the fifth transistor is electrically coupled to the source/drain of the third transistor.

A shift register in accordance with another embodiment of the present invention includes a control circuit and an output circuit. The control circuit is electrically coupled to receive a start pulse signal, a first clock pulse signal and a power supply voltage and further for producing an enable signal according to the start pulse signal and the first clock pulse signal. A logic low level of the first clock pulse signal is lower than a level of the power supply voltage. The output circuit is subjected to the control of the enable signal and further for producing a gate driving signal according to a second clock pulse signal. The second clock signal and the first clock signal are phase-inverted with respect to each other. A logic low level of the second clock pulse signal is higher than the level of the power supply voltage.

In one embodiment, the control circuit includes a first control transistor and a second control transistor. The gate of the first control transistor is electrically coupled to receive the first clock pulse signal, the source/drain of the first control transistor is electrically coupled to the power supply voltage, and the drain/source of the first control transistor is electrically coupled to the gate of the first control transistor through a coupling transistor. The gate of the second control transistor is electrically coupled to the gate of the first control transistor, the source/drain of the second control transistor is electrically coupled to the drain/source of the first control transistor and for outputting the enable signal, and the drain/source of the second control transistor is electrically coupled to receive the start pulse signal.

In one embodiment, the output circuit includes a first output transistor. The gate of the first output transistor is electrically coupled to receive the enable signal, the source/drain of the first output transistor is for outputting the gate driving signal, and the drain/source of the first output transistor is electrically coupled to receive the second clock pulse signal.

In one embodiment, the output circuit further includes a second output transistor for producing a second start pulse signal. The gate of the second output transistor is electrically coupled to the gate of the first output transistor, the source/drain of the second output transistor is for outputting the second start pulse signal, and the drain/source of the second output transistor is electrically coupled to the source/drain or the drain/source of the first output transistor.

In one embodiment, the shift register further includes a reset circuit. The reset circuit is subjected to the control of the first clock pulse signal and for resetting a potential at the terminal of the output circuit for outputting the gate driving signal to a second power supply voltage, and a level of the second power supply voltage is substantially equal to the logic low level of the second clock pulse signal.

A shift register in accordance with still another embodiment of the present invention includes a control circuit and a first output transistor. The control circuit has a start pulse signal input terminal, a first clock pulse signal input terminal and a power supply voltage input terminal and includes a first control transistor and a second control transistor. The gate of the first control transistor is electrically coupled to the first clock pulse signal input terminal, the source/drain of the first control transistor is electrically coupled to the power supply voltage input terminal, and the drain/source of the first control transistor is electrically coupled to the gate of the first control transistor through a coupling capacitor. The gate of the second control transistor is electrically coupled to the first clock pulse signal input terminal, the source/drain of the second control transistor is electrically coupled to the drain/source of the first control transistor, and the drain/source of the second control transistor is electrically coupled to the start pulse signal input terminal. The gate of the first output transistor is electrically coupled to the drain/source of the first control transistor, the source/drain of the first output transistor serves as a gate driving signal output terminal, and the drain/source of the first output transistor serves as a second clock pulse signal input terminal. Moreover, the first control transistor, the second control transistor and the first output transistor all are negative threshold voltage transistors.

In one embodiment, the source/drain of the first output transistor is further electrically coupled to the gate of the first output transistor through a coupling capacitor.

In one embodiment, the shift register further includes a second output transistor. The gate of the second output transistor is electrically coupled to the drain/source of the first control transistor of the control circuit, the source/drain of the second output transistor serves as a start pulse signal output terminal, and the drain/source of the second output transistor is electrically coupled to the gate driving signal output terminal or the second clock pulse input terminal. The second output transistor is a negative threshold voltage transistor.

In one embodiment, the shift register further includes a reset transistor. The gate of the reset transistor is electrically coupled to the first clock pulse signal input terminal of the control circuit, the source/drain of the reset transistor serves as another power supply voltage input terminal, and the drain/source of the reset transistor is electrically coupled to the gate driving signal output terminal. The reset transistor is a negative threshold voltage transistor.

In summary, the above-mentioned embodiments of the present invention propose particular designs applied to the circuit structure configuration and operation process of the shift register, so that the transistors of the shift register still can normally operate in the situation of the employment of high carrier mobility semiconductor material (e.g., IGZO). Accordingly, the shift register proposed by the present invention can achieve the purpose of effectively minimizing the size of transistor and reducing power consumption.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
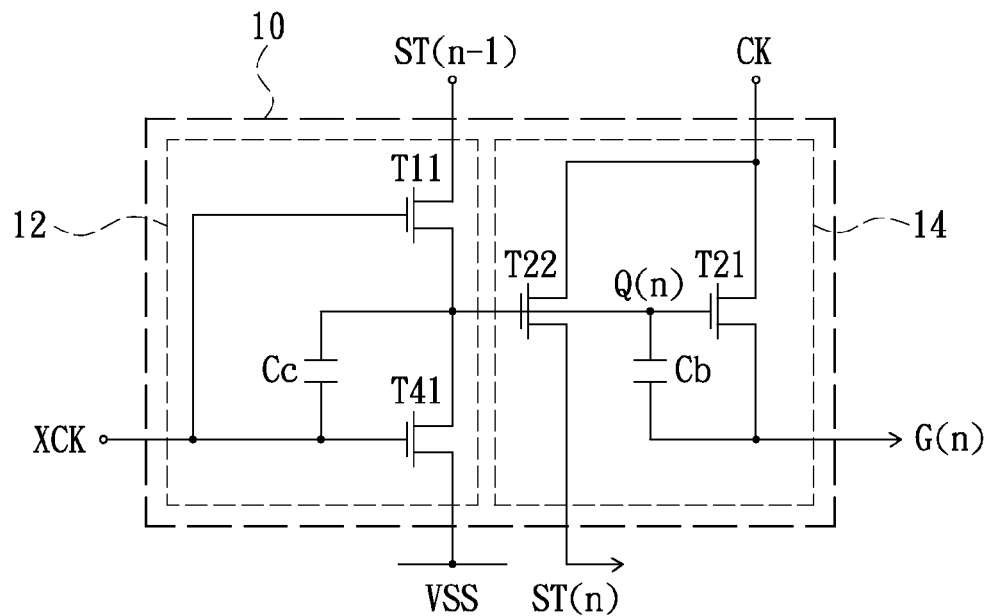
FIG. 1 shows a schematic circuit diagram of a shift register in accordance with a first embodiment of the present invention.

Referring to FIG. 1, a schematic circuit diagram of a shift register in accordance with a first embodiment of the present invention is shown. As illustrated in FIG. 1, the shift register 10 includes a control circuit 12 and an output circuit 14. Herein, it is noted that a plurality of shift registers connected in cascade can constitute a gate driving circuit (not shown), e.g., a gate driver on array (GOA) circuit, the shift register 10 can be any one stage of the cascade-connected shift registers.

Specifically, the control circuit 12 includes transistors T11, T41 and a coupling capacitor Cc. The transistors T11, T41 both are negative threshold voltage transistor, e.g., transistors employing a semiconductor material (e.g., IGZO) with high carrier mobility. The gate of the transistor T41 serves as a clock pulse signal input terminal to receive a clock pulse signal XCK, the source/drain of the transistor T41 is electrically coupled to a power supply voltage VSS and serves as a power supply voltage input terminal, and the drain/source of the transistor T41 serves as an output terminal for an enable signal Q(n) and is further electrically coupled to the gate of the transistor T41 through the coupling capacitor Cc. The gate of the transistor T11 is electrically coupled to the gate of the transistor T41 and subjected to the control of the clock pulse signal XCK, the source/drain of the transistor T11 is electrically coupled to the drain/source of the transistor T41, and the drain/source of the transistor T11 serves as a start pulse signal input terminal to receive a start pulse signal ST(n-1).

The output circuit 14 includes transistors T21, T22 and a coupling capacitor Cb. The transistors T21, T22 both are negative threshold voltage transistors, e.g., transistors employing a semiconductor material (e.g., IGZO) with high carrier mobility. The transistor T21 serves as an output transistor for a gate driving signal G(n), and the transistor T22 serves as an output transistor for another start pulse signal ST(n). In particular, the gate of the transistor T21 is electrically coupled to the drain/source of the transistor T41 of the control circuit 12, the drain/source of the transistor T21 serves as a clock pulse signal input terminal to receive another clock pulse signal CK, and the source/drain of the transistor T21 serves as a gate driving signal output terminal to output the gate driving signal G(n) and preferably is electrically coupled to the gate of the transistor T21 through the coupling capacitor Cb. The gate of the transistor T22 is electrically coupled to the drain/source of the transistor T41 of the control circuit 12, the drain/source of the transistor T22 is electrically coupled to the drain/source of the transistor T21 to receive the clock pulse signal CK, and the source/drain of the transistor T22 serves as a start pulse signal output terminal to output the start pulse signal ST(n).

Herein, it is indicated that when the shift register 10 serves as the last stage of the cascade-connected shift registers, the output circuit 14 generally is not given the transistor T22 to generate the start pulse signal ST(n). In addition, the skilled person in the art can omit the coupling capacitor Cb according to the actual consideration of design.

Figure 2:
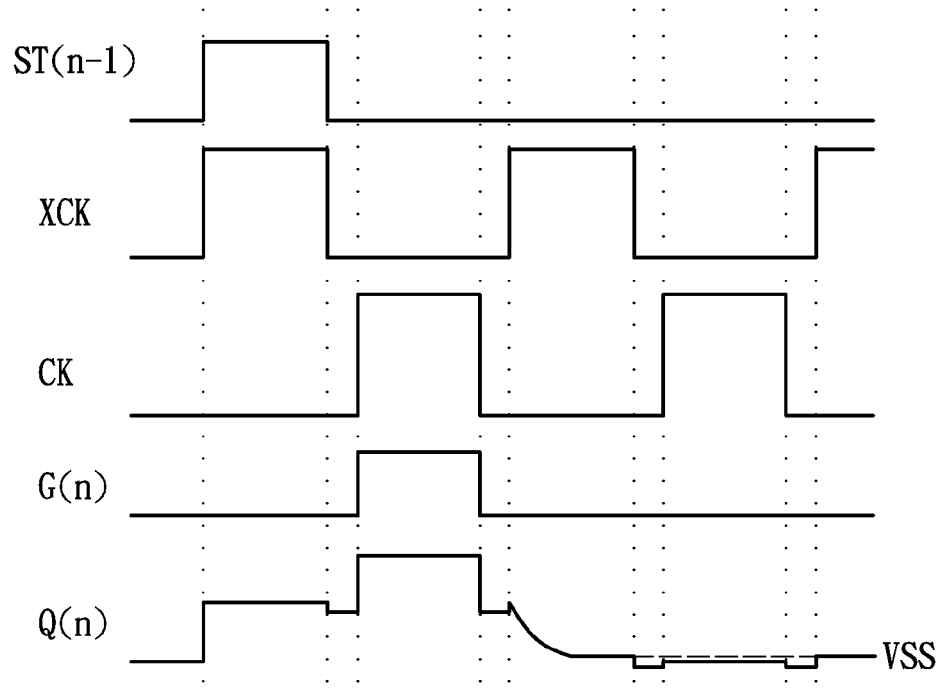
FIG. 2 shows timing diagrams of multiple signals in accordance with the first embodiment of the present invention.

The operation process of the shift register 10 in accordance with the first embodiment will be described below in detail with reference to FIGS. 1 and 2. FIG. 2 showing timing diagrams of the start pulse signal ST(n-1), the clock pulse signals XCK, CK, the gate driving signal G(n) and the enable signal Q(n). Herein, the clock pulse signal XCK and the clock pulse signal CK are phase-inverted, that is, when the clock pulse signal XCK is logic high, the clock pulse signal CK is logic low; whereas when the clock pulse signal CK is logic high, the clock pulse signal XCK is logic low. A logic low level of the clock pulse signal XCK is lower than the level of the power supply voltage VSS, and a logic low level of the clock pulse signal CK is higher than the level of the power supply voltage VSS, so that during each of the negative threshold voltage transistors T11, T41, T21 and T22 is switched off, a potential at the gate of each the transistor is lower than another potential at the source/drain thereof and the purpose of small switched-off current is achieved as a result.

Specifically, when the start pulse signal ST(n-1) and the clock pulse signal XCK both are logic high, and the clock pulse signal CK is logic low, the transistors T11, T41 of the control circuit 12 both are switched on. The enable signal Q(n) is pulled up to a predetermined potential and charges the coupling capacitor Cb of the output circuit 14 so as to enable the transistors T21, T22 of the output circuit 14. Subsequently, the start pulse signal ST(n-1) and the clock pulse signal XCK both become logic low, since the logic low level of the clock pulse signal XCK is lower than the level of power supply voltage VSS, the transistors T11, T41 of the control circuit 12 can be effectively switched off and a level of the enable signal Q(n) is slightly pulled down due to an reverse coupling effect of the coupling capacitor Cc.

Afterwards, the clock pulse signal CK is changed from logic low to logic high, the source/drain of the transistor T21 of the output circuit 14 outputs the gate driving signal G(n) (i.e., generally gate driving pulse) according to the clock pulse signal CK. Meanwhile, the source/drain of the transistor T22 of the output circuit 14 outputs the start pulse signal ST(n) according to the inputted clock pulse signal CK as a start pulse signal for next-staged shift register. At this time, the level of the enable signal Q(n) is further pulled up due to the characteristic of voltage continuity between the two terminals of the coupling capacitor Cb, so that the switched-on current of the transistor T21 is increased. Thereafter, the clock pulse signal CK becomes logic low, potentials at the source/drains of the transistors T21, T22 both are pulled down to equal to the logic low level of the clock pulse signal CK.

Then the clock pulse signal XCK becomes logic high, the transistors T11, T41 of the control circuit 12 is switched on, the enable signal Q(n) is discharged to the level of the power supply voltage VSS through the transistor T41, so that the potentials at the gates of the respective transistors T21, T22 of the output circuit 14 are lower than the level of the sources/drains thereof, and the transistors T21, T22 are effectively switched off. After that, the clock pulse signal XCK becomes logic low, due to the reverse coupling effect of the coupling capacitor Cc, the enable signal Q(n) is pulled down to a lower level. Then, when the clock pulse signal CK becomes logic high again, the level of the enable signal Q(n) would not exceed the level of power supply voltage VSS, so that the transistors T21, T22 of the output circuit 14 can maintain at effective switched-off state.

Figure 3:
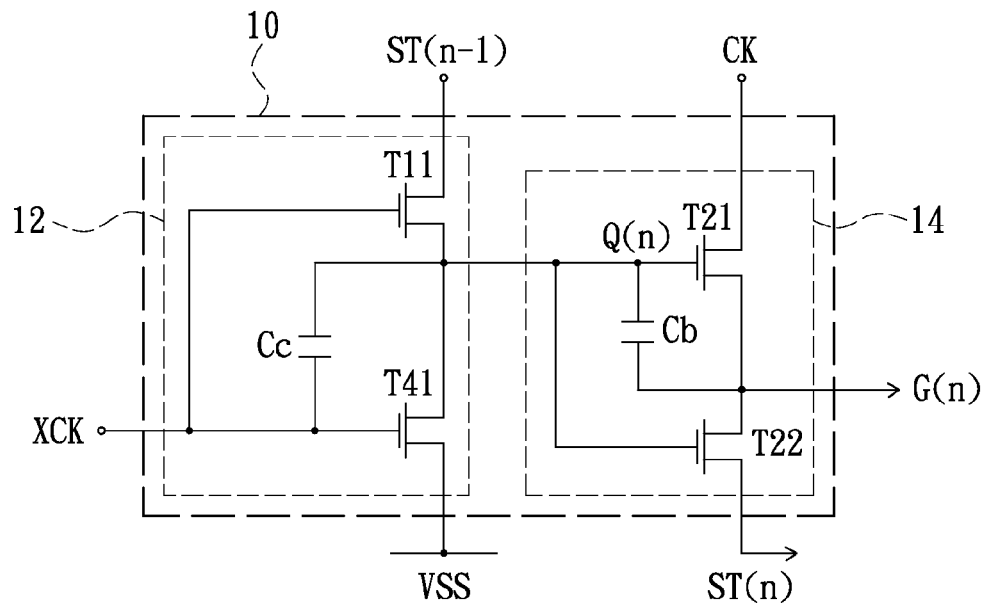
FIG. 3 shows another schematic circuit diagram of a shift register in accordance with the first embodiment of the present invention.

In addition, the circuit configuration of the shift register 10 in accordance with the first embodiment of the present invention is not limited to the illustration of FIG. 1, and can employ other circuit configuration for example the illustration of FIG. 3. In particular, the circuit configuration of the shift register 10 as illustrated in FIG. 3 is similar to that of the shift register as illustrated in FIG. 1 and the difference is that: the drain/source of the transistor T22 as illustrated in FIG. 3 is electrically coupled to the source/drain of the transistor T21, rather than electrically coupled to the drain/source of the transistor T21 and directly receiving the clock pulse signal CK as illustrated in FIG. 1.

Figure 4:
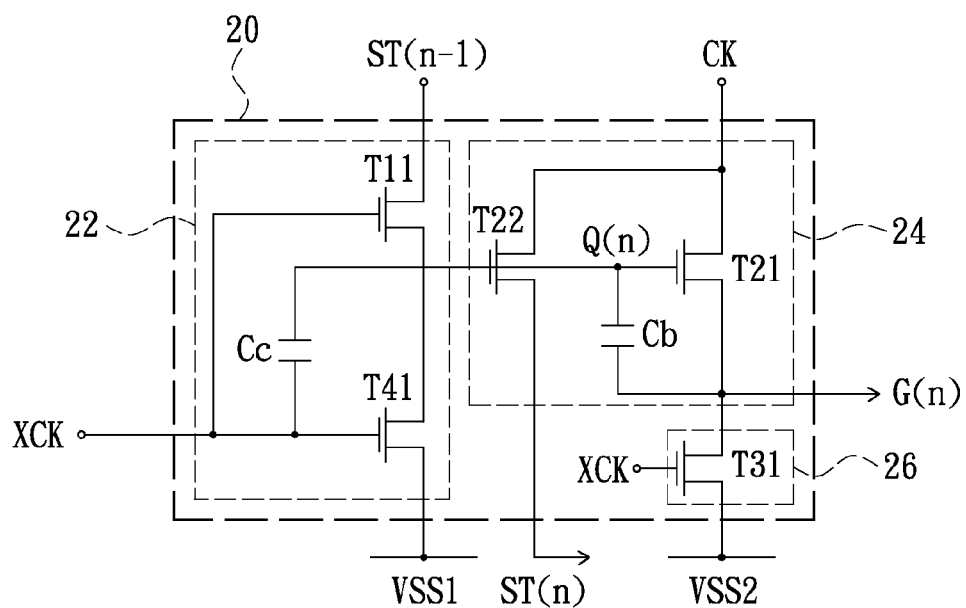
FIG. 4 shows a schematic circuit diagram of a shift register in accordance with a second embodiment of the present invention.

Referring to FIG. 4, a shift register in accordance with a second embodiment of the present invention is shown. As illustrated in FIG. 4, the shift register 20 includes a control circuit 22, an output circuit 24 and a reset circuit 26. Herein, it is noted that a plurality of shift registers connected in cascade can constitute a gate driving circuit (not shown), e.g., a gate driver on array (GOA) circuit, the shift register 20 can be any one stage of the cascade-connected shift registers.

Specifically, the control circuit 22 includes transistors T11, T41 and a coupling capacitor Cc. The transistors T11, T41 both are negative threshold voltage transistors, e.g., transistors employing a semiconductor material (e.g., IGZO) with high carrier mobility. The gate of the transistor T41 serves as a clock pulse signal input terminal to receive a clock pulse signal XCK, the source/drain of the transistor T41 is electrically coupled to the power supply voltage VSS1 and serves as a power supply voltage input terminal, and the drain/source of the transistor T41 serves as an output terminal of an enable signal Q(n) and is further electrically coupled to the gate of the transistor T41 through the coupling capacitor Cc. The gate of the transistor T11 is electrically coupled to the gate of the transistor T41 and subjected to the control of the clock pulse signal XCK, the source/drain of the transistor T11 is electrically coupled to the drain/source of the transistor T41, and the drain/source of the transistor T11 serves as a start pulse signal input terminal to receive a start pulse signal ST(n-1).

The output circuit 24 includes transistors T21, T22 and a coupling capacitor Cb. The transistors T21, T22 both are negative threshold voltage transistor transistors, e.g., transistors employing a semiconductor material (e.g., IGZO) with high carrier mobility. The transistor T21 serves as an output transistor for a gate driving signal G(n), and the transistor T22 serves as an output transistor for a start pulse signal ST(n). In particular, the gate of the transistor T21 is electrically coupled to the drain/source of the transistor T41 of the control circuit 22, the drain/source of the transistor T21 serves as a clock pulse signal input terminal to receive another clock pulse signal CK, and the source/drain of the transistor T21 serves as a gate driving signal output terminal for outputting the gate driving signal G(n) and preferably is electrically coupled to the gate of the transistor T21 through the coupling capacitor Cb. The gate of the transistor T22 is electrically coupled to the drain/source of the transistor T41 of the control circuit 22, the drain/source of the transistor T22 is electrically coupled to the drain/source of the transistor T21 to receive the clock pulse signal CK, and the source/drain of the transistor T22 serves as a start pulse signal output terminal for outputting a start pulse signal ST(n).

The reset circuit 26 includes a transistor T31. The transistor T31 is a negative threshold voltage transistor, e.g., a transistor employing a semiconductor material (e.g., IGZO) with high carrier mobility. The gate of the transistor T31 is electrically coupled to receive the clock pulse signal XCK, the source/drain of the transistor T31 is electrically coupled to the power supply voltage VSS2, and the drain/source of the transistor T31 is electrically coupled to the source/drain of the transistor T21 of the output circuit 24 so as to pull the potential at the source/drain of the transistor T21 down to the power supply voltage VSS2.

In the second embodiment, in order to achieve the purpose that: during each of the negative threshold voltage transistors T11, T41, T21, T22 and t31 being switched-off state, the potential at the gate of each the transistor is lower than the potential at the source/drain thereof and thereby a small switched-off current (i.e., generally leakage current) is realized, the clock pulse signals CK and XCK are set to be phase-inverted with respect to each other, the level of the power supply voltage VSS1 is set to be higher than the logic low level of the clock pulse signal XCK but lower than the logic low level of the clock pulse signal CK, and the level of the power supply voltage VSS2 is set to be substantially equal to the logic low level of the clock pulse signal CK.

It is indicated that, an operation process of the shift register 20 is similar to that of the shift register 10 in accordance with the first embodiment, and thus will not be repeated herein. In addition, when the shift register 20 serves as the last stage of the cascade-connected shift registers, the output circuit 24 might not be given the transistor T22 to generate the start pulse signal ST(n). Moreover, the skilled person in the art can omit the coupling capacitor Cb according to the actual consideration of design.

In summary, the above-mentioned embodiments of the present invention propose particular designs applied to circuit structure configuration and operation process of the shift register, so that the transistors of the shift register still can normally operate in the situation of the employment of high carrier mobility semiconductor material (e.g., IGZO, but not to limit the present invention). Accordingly, the shift register proposed by the present invention can achieve the purpose of effectively minimizing the size of transistor and reducing power consumption.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A shift register comprising:
   a plurality of transistors, subjected to the control of a start pulse signal, a first clock pulse signal and a second clock pulse signal to generate a gate driving signal, wherein the first clock pulse signal and the second clock pulse signal are phase-inverted with respect to each other, and a logic low level of the first clock pulse signal and another logic low level of the second clock pulse signal are different from each other;
   wherein the transistors are negative threshold voltage transistors, and a potential at the gate of each of the transistors is lower than another potential at the source/drain of the transistor in the situation of the transistor being switched off.

2. The shift register as claimed in claim 1, wherein the transistors comprises:
   a first transistor, wherein the gate of the first transistor is electrically coupled to receive the first clock pulse signal and further electrically coupled to the drain/source of the first transistor through a coupling capacitor, the source/drain of the first transistor is electrically coupled to a power supply voltage, and a level of the power supply voltage is higher than the logic low level of the first clock pulse signal but lower than the logic low level of the second clock pulse signal;
   a second transistor, wherein the gate of the second transistor is electrically coupled to receive the first clock pulse signal, the source/drain of the second transistor is electrically coupled to the drain/source of the first transistor, and the drain/source of the second transistor is electrically coupled to receive the start pulse signal; and
   a third transistor, wherein the gate of the third transistor is electrically coupled to the drain/source of the first transistor, the source/drain of the third transistor is for outputting the gate driving signal; and the drain/source of the third transistor is electrically coupled to receive the second clock pulse signal.

3. The shift register as claimed in claim 2, wherein the source/drain of the third transistor is further electrically coupled to the gate of the third transistor through another coupling capacitor.

4. The shift register as claimed in claim 2, wherein the transistors further comprises:
   a fourth transistor, wherein the gate of the fourth transistor is electrically coupled to the drain/source of the first transistor, the source/drain of the fourth transistor is for outputting another start pulse signal, and the drain/source of the fourth transistor is electrically coupled to the drain/source or the source/drain of the third transistor.

5. The shift register as claimed in claim 2, wherein the transistors further comprises:
   a fifth transistor, wherein the gate of the fifth transistor is electrically coupled to receive the first clock pulse signal, the source/drain of the fifth transistor is electrically coupled to receive a second power supply voltage, a level of the second power supply voltage is substantially identical to the logic low level of the second clock pulse signal, and the drain/source of the fifth transistor is electrically coupled to the source/drain of the third transistor.

* * * * *